United States Patent
Kao (10) Patent No.: US 6,427,991 B1
(45) Date of Patent: Aug. 6, 2002

(54) NON-CONTACT WORKPIECE HOLDER USING VORTEX CHUCK WITH CENTRAL GAS FLOW

(75) Inventor: Sam Kao, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/633,086

(22) Filed: Aug. 4, 2000

(51) Int. Cl.[7] .................................................. B23P 19/04
(52) U.S. Cl. ............................. 269/21; 269/95; 269/296
(58) Field of Search ........................... 269/21, 95, 296, 269/20; 279/3; 294/64.1; 451/388

(56) References Cited

U.S. PATENT DOCUMENTS

| | | | |
|---|---|---|---|
| 5,110,239 A | * 5/1992 | Riley et al. | 269/21 |
| 5,553,837 A | * 9/1996 | Kahale | 269/21 |
| 5,961,169 A | * 10/1999 | Kalenian et al. | 269/21 |
| 6,032,997 A | * 3/2000 | Elliott et al. | 269/21 |
| 6,173,648 B1 | * 1/2001 | Misono et al. | 269/21 |
| 6,286,822 B1 | * 9/2001 | Blick | 269/21 |

FOREIGN PATENT DOCUMENTS

WO WO 97/45862 12/1997

\* cited by examiner

Primary Examiner—Joseph J. Hail, III
Assistant Examiner—Lee Wilson
(74) Attorney, Agent, or Firm—Skjerven Morrill LLP; David T. Millers; David C. Hsia (57) ABSTRACT

A non-contact holder including one or more chucks holds a planar workpiece such as a semiconductor wafer, particularly a thin wafer. Each chuck in the holder includes a cavity that opens to a surface adjacent to the workpiece. A tangential orifice introduces a tangential gas flow into the cavity to create a vortex having a central, low-pressure region. A central orifice directs a gas flow into the low-pressure region of the vortex. The combination of gas flows creates a more uniform vacuum attraction holding a workpiece in close proximity to the chuck. The gas exiting from the chuck provides a cushion that prevents contact between wafer and chuck. Small diameter chucks located close to each other help avoid distortion when processing very thin workpieces. In addition to equalizing pressure, the central gas flow increases the angular spread of gas exiting from each chuck and thus simplifies the design of a holder providing a gas flow that inhibits entry of contaminants between the holder and the workpiece.

19 Claims, 6 Drawing Sheets

NON-CONTACT WORKPIECE HOLDER USING VORTEX CHUCK WITH CENTRAL GAS FLOW

CROSS-REFERENCE TO RELATED APPLICATIONS

The present patent document is a related to U.S. pat. app. Ser. No. 09/456,135, which is hereby incorporated by reference in its entirety.

BACKGROUND OF THE INVENTION

1. Technical Field

The present invention relates to holders for planar workpieces such as semiconductor wafers and to providing non-contact support for flexible workpieces without distorting or damaging of the workpiece.

2. Description of Related Art

Many manufacturing processes require a holder that holds a workpiece in position for processing. In particular, the processing that forms integrated circuits requires a holder that holds a semiconductor wafer without impeding the processing steps directed at an exposed surface of tie wafer. Safe holding of the wafer is more difficult if the wafer is particularly thin or fragile. In particular, many devices such as cellular telephones, smart cards, and the like require integrated circuits that are thin, e.g., less than about 50 $\mu$m. Fabricating the integrated circuits directly on thin wafers can be difficult because the thin wafers are prone to distortion, non-uniform processing, and even rupturing, during the processes required for integrated circuit fabrication. Accordingly, a typical process for manufacturing thin integrated circuit chips fabricates integrated circuits on the front of a wafer and then etches the back of the wafer to thin the wafer after fabrication of the integrated circuits is complete. Plasma etching is a typical method for wafer thinning. For economy of language herein, the "back" of a wafer refers to the surface of the wafer undergoing (or destined to undergo) the etching that thins the wafer. The "face" of the wafer denotes the surface of the wafer not undergoing etching, typically having the integrated circuits thereon. Accordingly, the face of a wafer lies in close proximity to the wafer holder during wafer thinning.

Successful wafer thinning presents several challenges. One challenge is the thickness of the wafer, which is (or soon becomes) very thin, rendering the wafer susceptible to distortion. Distortion generally leads to non-uniform etching, non-uniform heating of the wafer (as during plasma etching, for example) and potential damage to the integrated circuits lying on the face of the wafer. Thus, a wafer holder must be able to hold a thin, easily distorted wafer in a flat position during etching. Of course, the wafer holder must not contact the exposed integrated circuits lying on the face of the wafer next to the wafer holder. Thus, non-contact support for a flexible wafer is needed.

Another challenge for the wafer holder is preventing reactants and debris, e.g., from the etching that thins the wafer, from damaging or contaminating the integrated circuits on the face of the wafer. Non-contact support implies a gap between the wafer and the holder. The holder clearly needs to keep etching reactants and debris out of this gap. More stringently, the wafer holder should protect the thin edge of the wafer from damage and contamination. While not as serious a problem as protecting the face of the wafer, edge contamination may lead to defects in the integrated circuits lying on the contaminated regions of the edge.

Siniaguine and Steinberg (PCT International Publication No. WO/97/45862, hereinafter "'45862") describe a non-contact holder for wafer-like objects in which a vortex of rotating air provides both the vacuum support for the wafer while providing the air cushion ensuring non-contact with the wafer holder.

SUMMARY OF THE INVENTION

The present invention relates to a non-contact holder for flexible workpieces and is particularly suited for holding thin workpieces without substantial distortion. One embodiment of the present invention is a chuck having one or more tangential orifice on a curved surface of a cavity. The cavity opens to a surface of the chuck that is adjacent a workpiece held by the chuck. The tangential orifice introduces a gas flow into the cavity in a direction having a component tangential to the curved surface of the cavity. This gas flow creates of a vortex within the cavity, and the vortex creates vacuum attraction to hold a workpiece in close proximity to the chuck. Gas exiting from the cavity prevents contact between wafer and chuck. Additionally, one or more central orifice on a top portion of the cavity of the chuck introduces gas to reduce the vacuum attraction at the center of the chuck. The central orifice can introduce gas along the central axis of the cavity or offset from and/or at an angel with the central axis. The chuck with the central and tangential orifices has the advantage of applying a more uniform holding force to the workpiece thereby causing less distortion or damage of the workpiece.

Many small diameter chucks in accordance with the invention can be located close together to help avoid distortion or damage when holding very thin wafers for processing. Each chuck has a preferential path for the exiting gas according to the location of the tangential orifice, and the combination of the gas exiting from the chucks provides a gas flow that resists entry of debris or reactants between the workpiece. The gas flow from the central orifice widens the flow of exiting gas from each chuck, and allows more freedom in the number and positioning of chucks to provide a more uniform gas flow around the perimeter of the workpiece.

One specific embodiment of the invention is a chuck that includes a cavity, a first orifice, and a second orifice. The cavity opens at a surface that is adjacent a workpiece when the chuck holds the workpiece. The first orifice directs a first gas flow into the cavity, and the first gas flow creates a vortex having a low-pressure region. The second orifice directs a second gas flow into the low-pressure region of the vortex. The combination of the first and second gas flows creates a more uniform pressure profile under the chuck and thereby reduces distortion of a workpiece held in the chuck.

Another embodiment of the invention is a workpiece holder that includes a plurality of chucks. Each chuck includes a cavity, a first orifice, and a second orifice. The cavities of the chucks open at a surface that is adjacent a workpiece when the holder holds the workpiece. The first orifice in each chuck directs a first gas flow into the cavity, and the first gas flow creates a vortex having a low-pressure region that attracts the workpiece to the surface of the holder. The second orifice directs a second gas flow into the low-pressure region of the vortex. Gas exiting from chucks fans out around the perimeter of the workpiece to provide a uniform gas flow that protects a face of the workpiece from debris and reactants that might otherwise enter the space between the holder and the workpiece.

BRIEF DESCRIPTION OF THE SEVERAL VIEWS OF THE INVENTION

Use of the same reference symbols in different figures indicates similar or identical items.

DETAILED DESCRIPTION OF THE INVENTION

A non-contact holder for flexible workpieces includes a cavity, a tangential orifice, and a central orifice. The tangential orifice introduces a gas flow that creates a vortex in the cavity. A low-pressure region forms at the center of the vortex, and the low-pressure region creates a vacuum attraction when a workpiece is in close proximity to the holder. Gas escaping from the cavity creates a vapor cushion that prevents the workpiece from contacting or coming too close to the chuck. Accordingly, the forces on the workpiece include an attractive force near the center of the chuck and a repulsive force at the perimeter of the chuck. The central orifice introduces a gas flow into the low-pressure region of the vortex and thereby reduces the central attractive force. As a result, the holder applies to the workpiece forces that are more uniform than the forces applied by a holder lacking a central orifice.

The processing of semiconductor wafers as may typically occur in the production of integrated circuits or in wafer post-processing for thinning provides an exemplary application of embodiments of the invention. However, the processing of any flexible planar workpiece in a non-contact holder is also a potential application for the present invention. Substrates for flat panel displays, printed circuit boards, various films (possibly having layered structures), construction materials such as plywood, paneling and the like may require processing while held in a suitable holder. Such workpieces may be relatively large (perhaps 10 meters across). In addition, such workpieces may be flexible, readily subject to distortion or damage in the holder. The present invention provides non-contact support for such objects while avoiding unacceptable distortion. The commercially important processing of semiconductor wafers is described as a particularly suitable application of the invention. However, embodiments of the invention also apply to other workpieces requiring non-contact support without substantial distortion.

Figure 1:
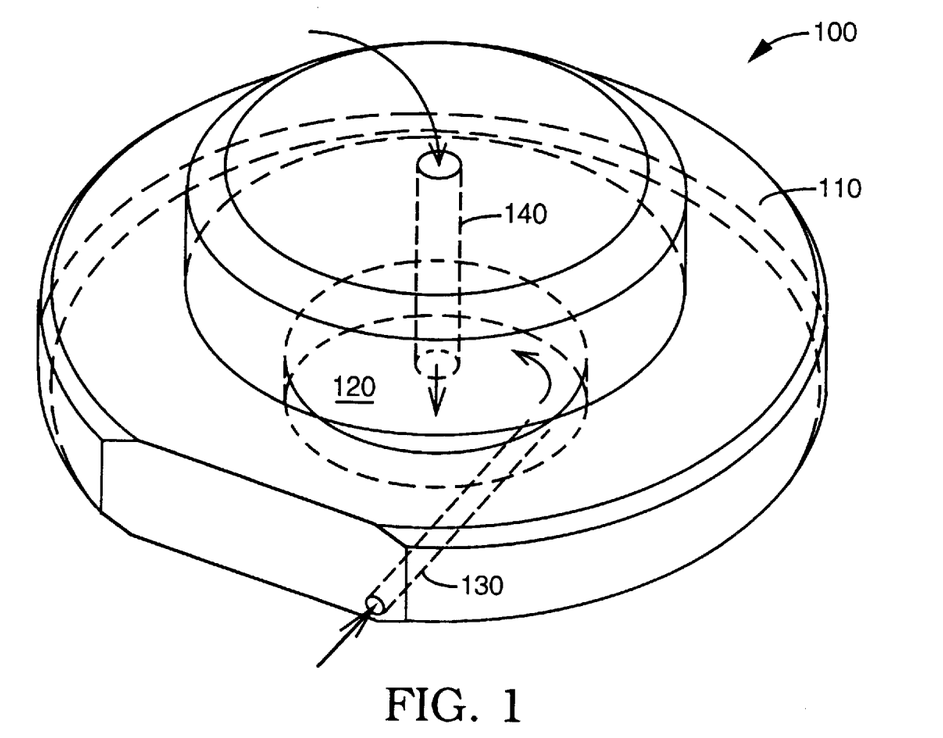
FIG. 1 is a semi-transparent perspective view of a chuck in accordance with an embodiment of the invention.
Figure 2:
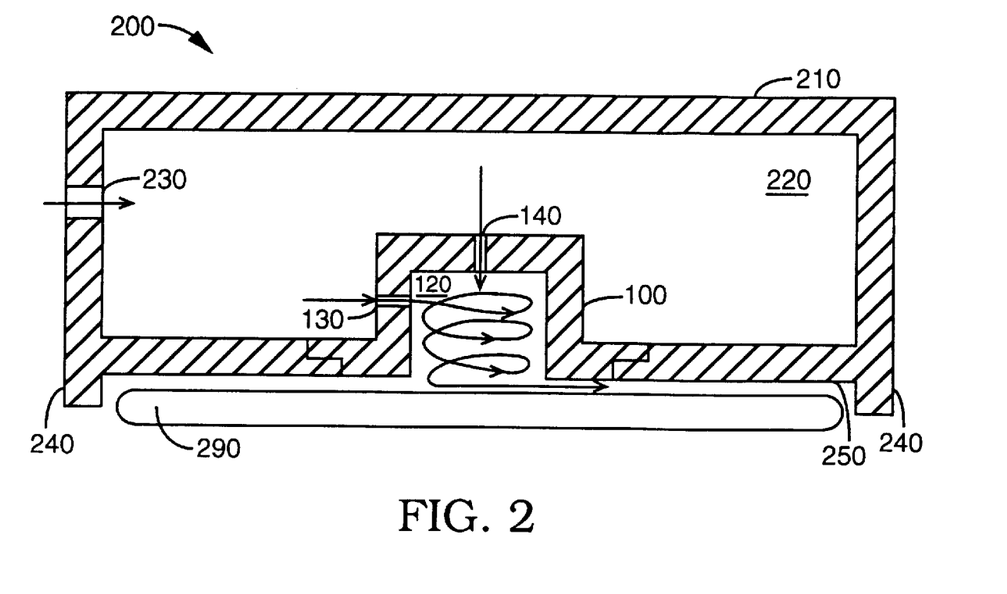
FIG. 2 is a cross-sectional view of the chuck of FIG. 1 in a wafer holder.

FIG. 1 is a semi-transparent, perspective view of a chuck 100 in accordance with an embodiment of the invention. Chuck 100 includes a body 110 formed from a rigid material such as a metal. Body 110 surrounds upper portions of a cavity 120, which is also illustrated in FIG. 2. Cavity 120 has a smooth inner wall that facilitates a circulating gas flow within cavity 120. In particular, FIG. 1 illustrates cavity 120 as being cylindrical, but a hemispherical cavity or a cavity having another shape might also be employed.

Other important features of chuck 100 are a tangential orifice 130 and a central orifice 140, which conduct gas flows into cavity 120. The tangential orifice 130 introduces a gas flow that is substantially parallel to a surface of a workpiece adjacent chuck 100. This gas flow has a tangential component and creates a vortex inside cavity 120. Although FIG. 1 shows a single tangential orifice 130, other tangential orifices could be provided to add gas flows that contribute in the creation of the vortex. Central orifice 140 provides a gas flow into a low-pressure region at the center of the vortex. In FIG. 2, central orifice 140 is on a central axis of cavity 120. Central orifice 140 directs a gas flow perpendicular to the surface of the substrate, but alternatively the gas flow could be at an angle selected to affect or change the preferential direction of gas exiting from chuck 100. Additionally, multiple central orifices could direct gas flows into the low-pressure region of the vortex. The multiple central orifices could be off the central axis and provide a gas flow at an angle that partly contributes to or inhibits the creation of the vortex in cavity.

FIG. 2 is a conceptual cross-sectional view of a holder 200 including the chuck 100 mounted in a holder body 210. Although FIG. 2 only shows a single chuck 100 mounted on holder body 210, a more topical configuration would include multiple chucks mounted along a surface 250 of holder 200. U.S. pat. app. Ser. No. 09/456,135, which is incorporated by reference above, further describes examples of holders including multiple vortex chucks. Chuck 100 can replace the chucks in holder configurations that U.S. pat. app. Ser. No. 09/456,135 discloses. Holder body 210 further includes a cavity 220 that is pressurized via a gas inlet 230. Gas (e.g., air or nitrogen) in cavity 220 is under positive pressure. The pressure depends on the application of holder 200, but for holding a flexible wafer, the pressure is modest, for example, a positive pressure between about 3 psi (pounds per square inch) and about 100 psi or preferably between 5 and 30 psi. The gas in cavity 220 is optionally a temperature-controlled gas, typically cooled relative to the processing environment of the wafer 290. The pressurized gas in cavity 220 flows out of cavity 220 and into cavity 120 via orifices 130 and 140. In particular, tangential orifice 130 introduces gas that is flowing in a direction having a component that is tangential to walls of cavity 120 and nearly parallel to a bottom surface of 250 of holder 200. The tangential flow from tangential orifice 130 creates a vortex having a low-pressure region in a central portion of cavity 120.

When a wafer 290 is sufficiently close to holder 200, the ambient pressure on wafer 290 and the low-pressure region in cavity 120 cause an attractive force (referred to herein as the vacuum attraction) on wafer 290. The vacuum attraction draws wafer 290 into close proximity to surface 250 of holder 200 and can be used to lift wafer 290 into a mounted position on holder 200. The vacuum attraction tends to increase as the velocity of gas flow in the vortex increases. Accordingly, increasing the pressure in cavity 220, which increases gas flow velocity, increases the attractive force between wafer 290 and holder 200, and changes in the pressure in cavity 220 can be used to lift or release wafer 290. The diameters of tangential orifice 130 and cavity 120 similarly affect the gas velocity and the resulting vacuum attraction.

Gas escaping from cavity 120 along surface 250 creates a gas cushion between wafer 290 and holder 200 that prevents wafer 290 from contacting holder 200. In particular, wafer 290 reaches an equilibrium or mounted position when the vacuum attraction pulls wafer 290 close enough that the force of the cushion balances the vacuum attraction and other forces (e.g., gravity force) on wafer 290. The mounted position depends somewhat on the orientation of holder 200

(e.g., whether holder 200 is above or below wafer), but the vacuum attraction is typically much larger than the force of gravity on the wafer. In a typical application as illustrated in FIG. 2, holder 200 is above wafer 290 and exposes the back of wafer 290 to processing such as plasma etching that thins wafer 290. This wafer orientation offers an advantage in that gravity pulls etching debris away from wafer 290 rather than keeping debris close to wafer 290. However, holder 200 can be used at any angle or below wafer 290. Projections 240 (e.g., limiting pins) extending from holder body 210 limit motion of wafer 290 along surface 250 because the vacuum attraction and the air cushion provide virtually no lateral frictional. Additionally, a wafer brake such as described further below can be added to resist rotation of wafer 290 while held in holder 200.

Central orifice 140 introduces a gas flow into the low-pressure region of the vortex created in cavity 120. This gas flow increases the pressure at the center of the vortex. To maintain an attractive force, the size or gas flow rate through of central orifice 140 must be controlled so that the low pressure region of the vortex still provides a net attractive force sufficient to hold a wafer 290 near the lower surface 250 of holder 200. In FIG. 2, tangential orifice 130 and central orifice 140 have the same source (e.g., cavity 220) of pressurized gas. Alternatively, separate gas sources could supply gas to orifices 130 and 140. Accordingly, in holder 200, the relative sizes of cavity 120, tangential orifice 130, and central orifice 140 are selected to provide the desired attractive force.

Figure 3:
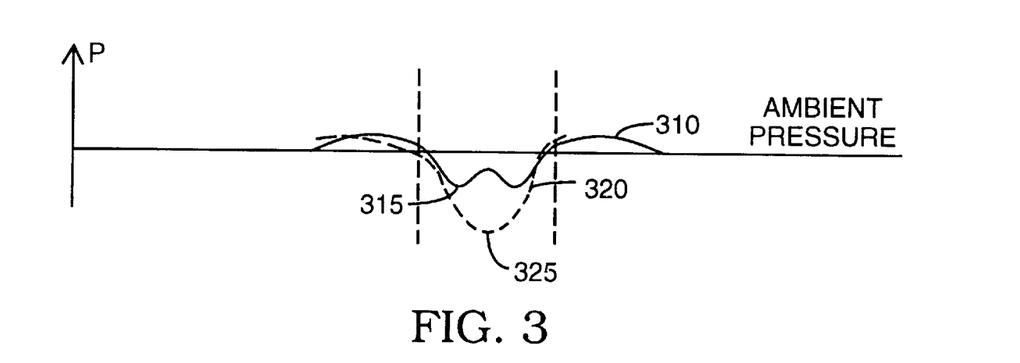
FIG. 3 shows plots of the pressures for chucks with and without a gas flow into a central region of a vortex.

FIG. 3 shows a plot 310 (and a plot 320) of the pressure beneath chuck 100 and portions of surface 250 adjacent chuck 100 with (and without) gas flow through central orifice 140. For both plots 310 and 320, the central portion of FIG. 3 corresponds to the center of the vortex in cavity 120. Beneath surface 250 the pressure is higher than the ambient pressure on the back of wafer 290. The pressure in the vortex is lower than the ambient pressure on the back of wafer 290 as required to cause the vacuum attraction. However, the minimum pressure 325 without gas flow through central orifice 140 is more extreme than is the minimum pressure 315 with gas flow through central orifice 140. The greater disparities in the pressure without gas flow through central orifice 140 causes greater deformation of a thin wafer. The more-uniform pressure profile is particularly suited for the uniform support of thin, flexible wafers, leading to uniform etching of the exposed wafer back.

Figure 4:
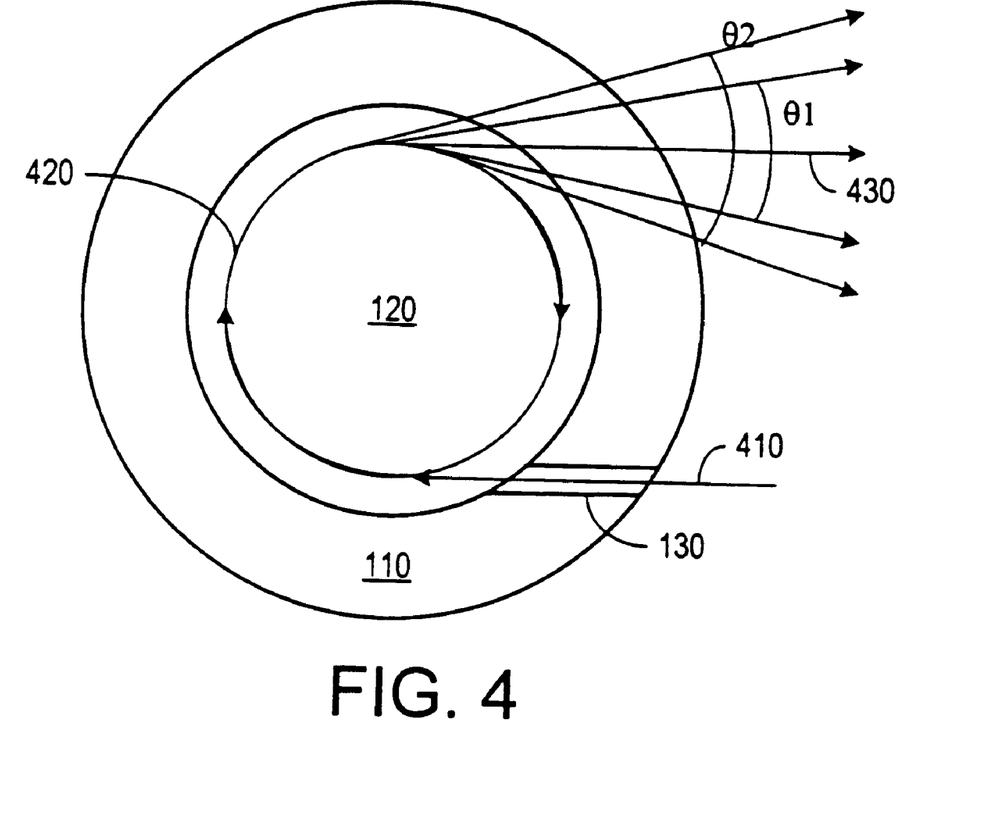
FIG. 4 illustrates a preferential direction of gas exiting from under a chuck in accordance with and embodiment of the invention.

FIG. 4 illustrates another advantage of having a gas flow through central orifice 140. In particular, a gas flow 410 through tangential orifice 130 creates a vortex 420 in which the flow of gas circulates a specific number of times (e.g., through a specific number of degrees) and tends to preferentially exit along a path 430. The direction of dominant exit path 430 depends on the size and geometry of cavity 120 and tangential orifice 130 and the velocity of the gas flowing into cavity 120. With no flow through central orifice 140, the exiting gas is predominantly within an angle θ1 around path 430. A gas flow through central orifice 140 changes vortex 420 and path 430. FIG. 4 shows only a single preferred path 430, but more generally the preferred path differs depending on the flows through orifices 130 and 140. More importantly the exiting gas is predominantly within a larger angle θ2 around exit path 430. With appropriate selection of the chuck's geometry, angle θ2 can be made as large as 360°. The larger exit angle simplifies the task of providing a gas flow that prevents debris and reactants from reaching the face of a wafer held in holder 200.

Figure 5:
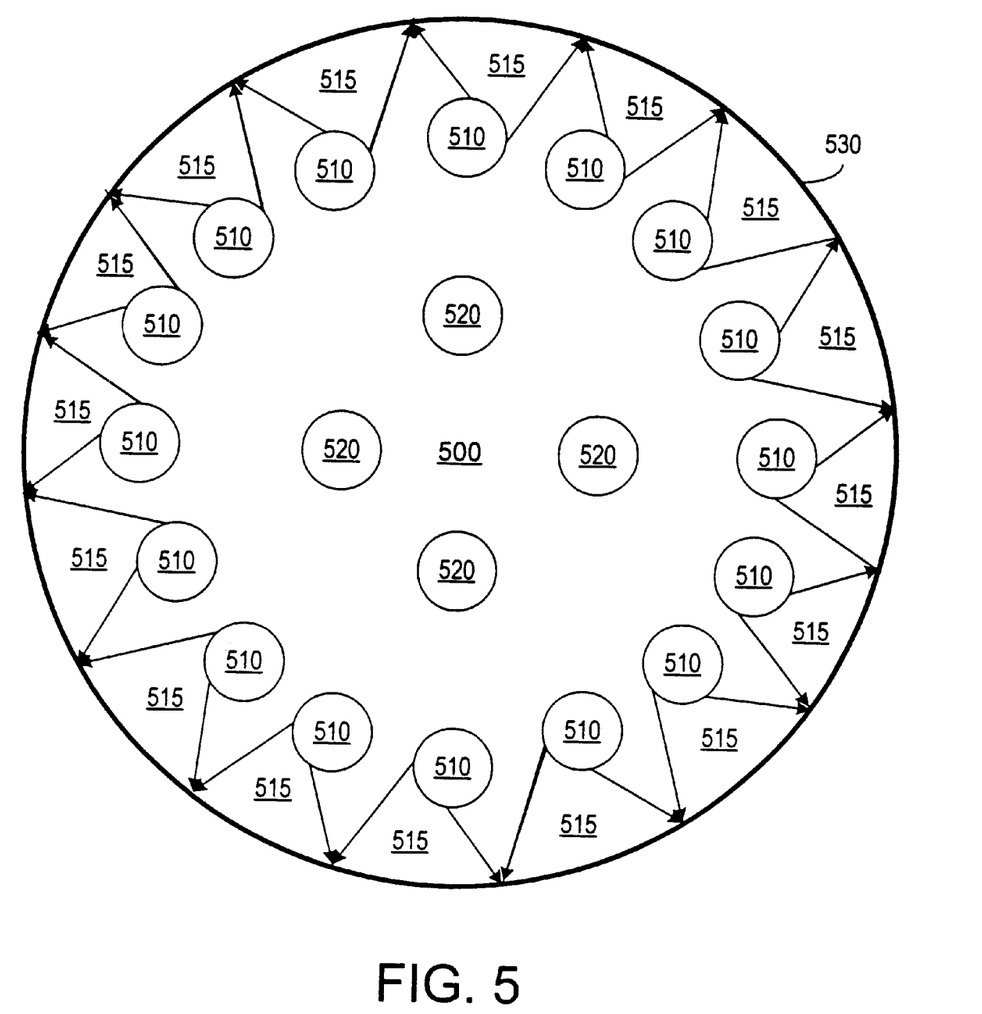
FIG. 5 is a plan view of a holder including multiple chucks in accordance with an embodiment of the invention.

FIG. 5 is a plan view of a holder 500 including multiple chucks 510 and 520. Chucks 510 and 520 are of substantially the same design as chuck 100 described above. Chucks 510 are near the perimeter of holder 500, and each chuck 510 has a gas flow exiting predominantly within a range 515 of exit paths. The combination of angular ranges 515 of predominant exit paths cover the entire perimeter of holder 500 to inhibit entry of debris or reactants between holder 500 and a workpiece/wafer. Since gases exiting from chucks 510 have a wider angular spread due to the gas flow from center orifices, the exit gas flows of chucks 510 more easily cover the perimeter of holder 500 when chucks 510 are arranged near the edge of holder 500. Interior chucks 520 can be identical to chucks 510 or can be designed to provide a different vacuum attraction from that of chucks 510.

One important application of the present invention is the support of thin wafers that are particularly subject to distortion during processing. Typically such wafers would have a thickness less than approximately 300 $\mu$m (micrometers or microns), often less than about 150 $\mu$m, and can be as thin as about 5 $\mu$m. Initially thick wafers may be supported in a holder of the present invention for the purpose of thinning. Thus, the capability of the present holder to support thin wafers adequately and without damage could permit process engineers to fabricate thinner wafers, thereby advancing the state of the art in wafer fabrication. For example, to support adequately and without significant distortion silicon wafers having a thickness greater than about 500 microns, cavity 120 has a diameter less than about 10 mm is satisfactory. For silicon wafers less than about 100 microns thick, chuck diameters less than about 6 mm are required.

Figure 6:
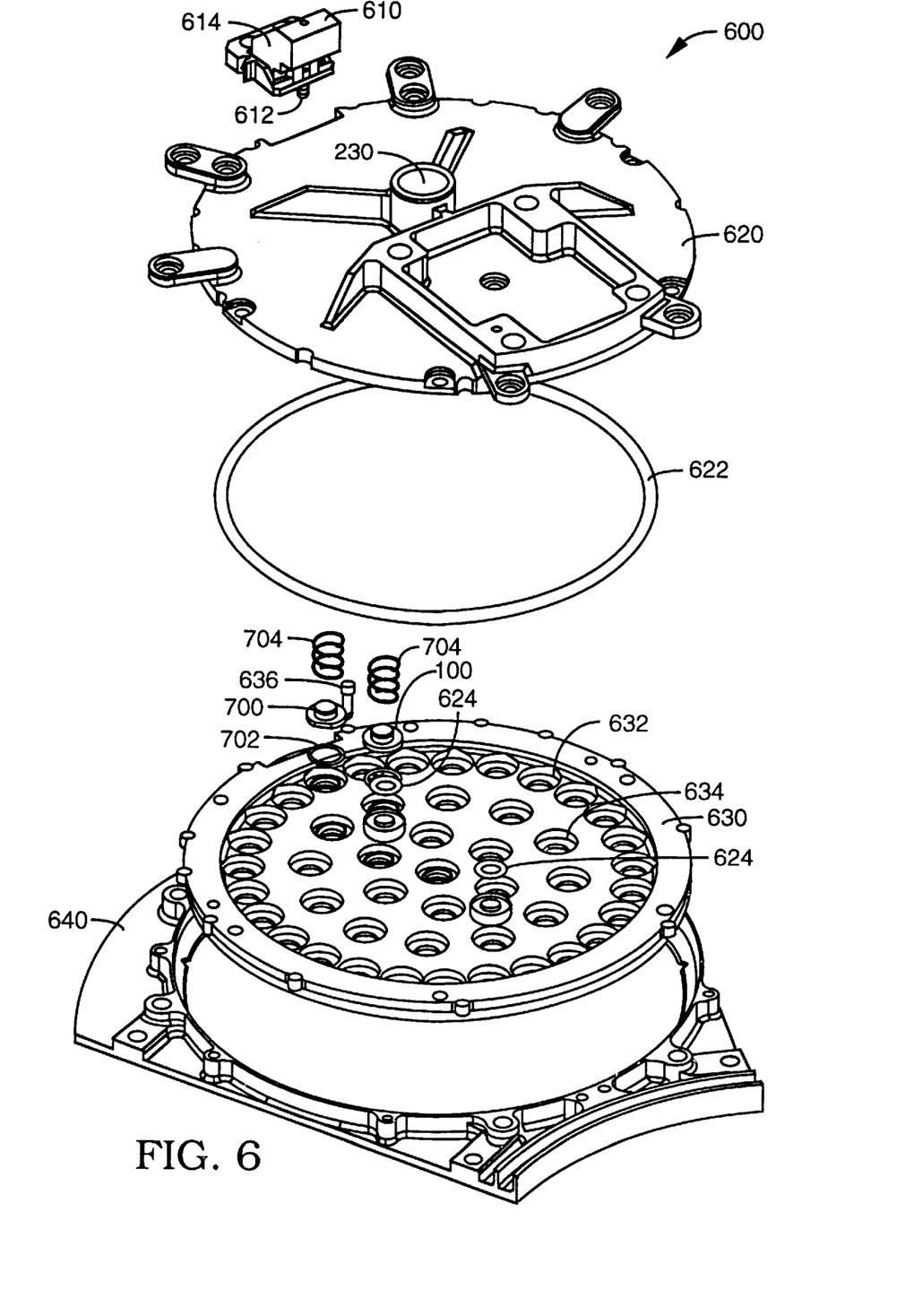
FIG. 6 is an expanded view of a holder in accordance with an embodiment of the invention.

FIG. 6 is an expanded perspective view of a holder 600 for holding a wafer. Holder 600 includes a top plate 620 and a bottom plate 630. Plates 620 and 630, when bolted together, form a cavity having an inlet 230 and a plurality of outlets 632 and 634. O-rings 622 and 624 go between top plate 620 and bottom plate 630 to respectively seal around the perimeter of the cavity and around bolts attaching central portions of plates 620 and 630. In an exemplary embodiment., each plate 620 and 630 is made of a durable material such as an aluminum alloy and has a diameter of about 6.3 inches, and holder 600 accommodates a 6-inch wafer.

Bottom plate 630 attaches to a mounting plate 640 and receives wafers through an opening in mounting plate 640. Pins 636, which are made of a durable material such as stainless steel, extend through bottom plate 630 into a region where a wafer resides when held in holder 600. Pins 636 restrict lateral movement of the wafer. Such restriction is particularly necessary because the non-contact attractive force provides practically no friction that could keep the wafer stationary. To prevent unwanted rotation of the wafer, a wafer brake 610 is mounted on top plate 620 and includes a protrusion 612 that extends to a region adjacent a wafer when the wafer is held in holder 600. Protrusion 612 is attached to a weighted hinge 614, and when holder 600 moves, centripetal force rotates weighted hinge 614 to bring protrusion 612 into contact with the edge of the wafer. Protrusion 612 thus prevents rotation of the wafer caused by movement of holder 600.

Bottom plate 630 includes a recessed portion, exterior outlets 632, and interior outlets 634. The recessed portion forms the cavity that provides the gas supply to vortex chucks 700 mounted in bottom plate 630. Exterior outlets 632 are around the perimeter of bottom plate 632, and interior outlets 634 are within a ring of exterior outlets 632. Each of exterior outlets 632 and interior outlets 634 is sized to accommodate one vortex chuck 700 and has a wider top portion (about 0.500 inches in diameter) and a narrower through hole (about 0.300 inches in diameter). For ease of illustration, FIG. 6 only shows two vortex chucks 100. Each outlets additionally includes an indentation to accommodate an o-ring 702 that goes between bottom plate 630 and the respective vortex chucks 700. Each chuck 700 is further accompanied by a spring 704 that fits around an upper portion of the chuck 700. When plates 620 and 630 are assembled, top plate 620 compresses spring 704, which then holds a chuck 700 in place in a corresponding outlet 632 or 634.

In the exemplary embodiment, bottom plate 630 accommodates 27 exterior chucks and 19 interior chucks to hold a 6-inch wafer. Holders for other size wafers would be larger or smaller than holder 600 and would typically contain more or fewer vortex chucks depending on the size of the wafer. Although larger or smaller chucks could be used, chucks 700, which are sized for a wafer of a particular thickness or strength, are best used in larger or smaller holders if those larger or smaller holder hold wafers having the same thickness as wafers held in holder 600.

Figure 7:
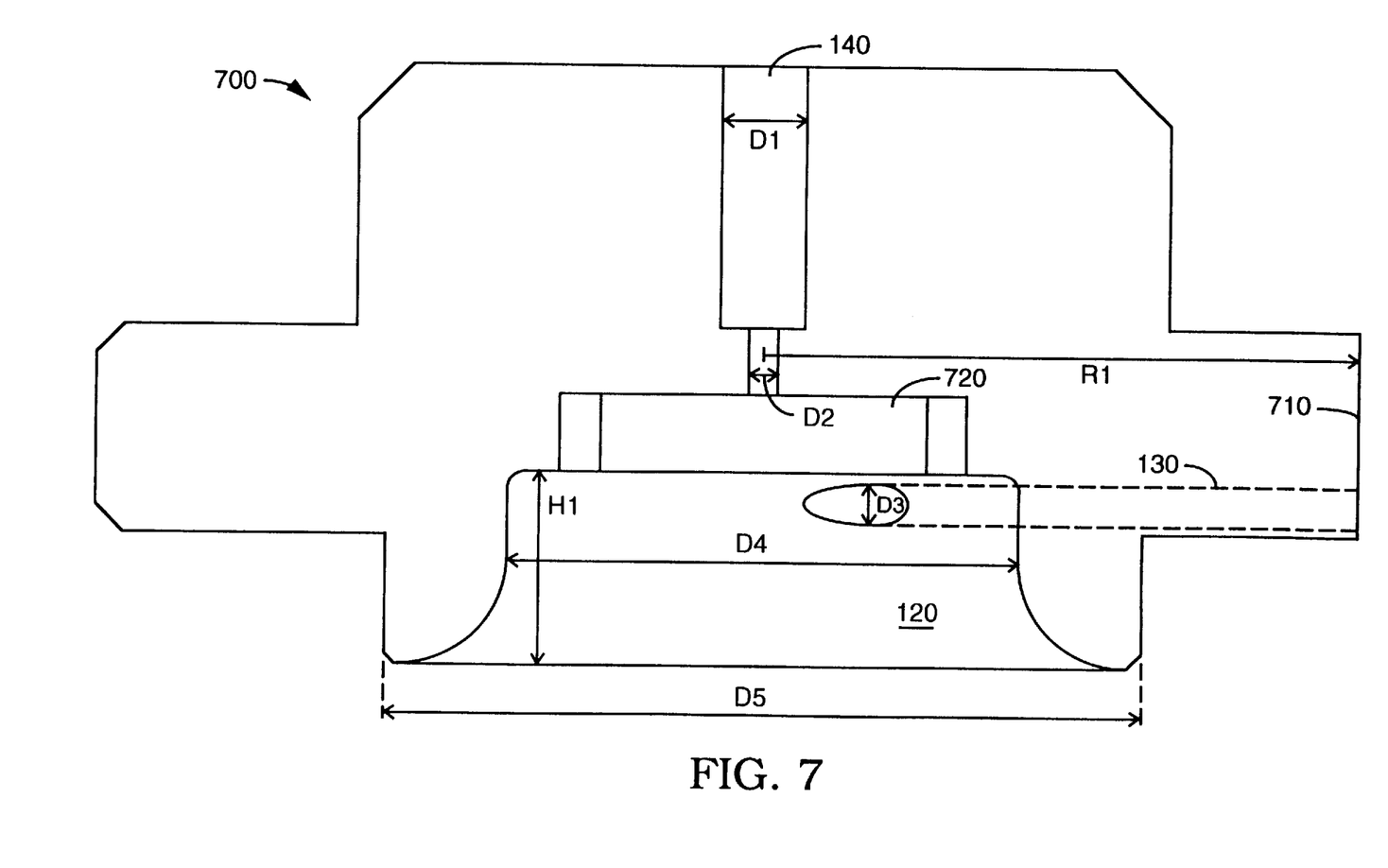
FIG. 7 is a cross-sectional view of a chuck in accordance with an embodiment of the invention.

FIG. 7 shows an exemplary embodiment of chuck 700. The widest portion of chuck 700 has a diameter of about 0.492 inches, which is slightly smaller that the openings in bottom plate 630 that accommodate the chucks. The perimeter of this widest portion is substantially circular except for a flat 710 that crosses perpendicular to a radius of the circle, at a distance R1 from the center of the circle. In the exemplary, embodiment distance R1 is about 0.220 inches. Tangential orifice 130, which has a diameter D3 of about 0.016 inches, starts at flat 710 and runs perpendicular to flat 710. Tangential orifice 130 is offset about 0.085 inches from the center of flat 710 so that orifice 130 introduces a tangential gas flow into cavity 120. Flat 710 facilitates drilling of tangential orifice 130 and provides a path for gas flow into tangential orifice 130 when chuck 700 is inside a circular outlet 632 or 634. Central orifice 140 has a stepped size with a top opening having a wider diameter D1 of about 0.030 inches and an opening into cavity 120 having a narrower diameter D2 of about 0.010 inches. Cavity 120 has a height Hi of about 0.075 inches, a diameter D4 of about 0.188 inches, and curved sides that widen out to an opening with a diameter D5 of about 0.280 inches.

Chuck 700 is similar to chuck 100 of FIG. 1, but chuck 700 further includes a slot 720 in the top surface of cavity 120. In the illustrated embodiment, slot 720 is straight about 0.150 inches long and about 0.030 inches wide and deep with rounded ends. In accordance with an aspect of the invention, slot 120 is present in chuck 700 to facilitate adjustment of the orientation of chuck 700 when chuck 700 is in a holder such as holder 600 of FIG. 6. In particular, when chuck 700 is assembled in holder 600, a screwdriver can be inserted into slot 720 and turned to rotate chuck 700 into the desired orientation. Accordingly, holder 600 does not require disassembly to adjust the orientations of chucks 700.

A straight slot 720 is just an exemplary implementation of a fixture accessible from the underside of a chuck for adjustment of the chuck's orientation. Alternatively, a chuck could employ slots of different shapes, e.g., crosses for Phillips-head screwdrivers or hexes for allen keys, could be employed or protrusions that match adjustment tools. However, slot 720 of FIG. 7 is found to have negligible effect on gas flow in cavity 120, and an alternative fixture would have a similar property.

Although the invention has been described with reference to particular embodiments, the description is only an example of the invention's application and should not be taken as a limitation. In particular, the example dimensions and pressures are purely for illustration of exemplary embodiments of the invention and a wide variety of sizes and pressures could be employ depending on the field of use. Various other adaptations, additions, and combinations of features of the embodiments disclosed are within the scope of the invention as defined by the following claims.

I claim:

1. A chuck comprising:
    a cavity having an open end at a surface of the chuck, the surface being adjacent a workpiece when the chuck holds the workpiece;
    a first orifice oriented to direct a first gas flow into the cavity, the first gas flow creating a vortex that surrounds a low-pressure region; and
    a second orifice oriented to direct a second gas flow into the low-pressure region of the vortex.

2. The chuck of claim 1, wherein the second gas flow is perpendicular to the first gas flow.

3. The chuck of claim 2, wherein the first gas flow is parallel to the surface.

4. The chuck of claim 1, wherein the second gas flow is at an angle relative to the first gas flow.

5. The chuck of claim 1, further comprising a fixture in the cavity.

6. The chuck of claim 5, wherein the fixture is a slot that is sized and shaped to accommodate a tool that adjusts an orientation of the chuck.

7. A chuck comprising:
    a body;
    a cavity having an open end at a surface of the body, the surface being adjacent a workpiece when the chuck holds the workpiece;
    an orifice oriented to direct a gas flow into the cavity, the gas flow creating a vortex that surrounds a low pressure region, and the gas flow exiting the cavity predominately within a range of exit paths; and
    a fixture in the cavity, the fixture being sized and shaped to accommodate a tool that adjusts an orientation of the chuck to change an orientation of the range of exit paths.

8. The chuck of claim 7, wherein the fixture is a slot.

9. A holder comprising a plurality of chucks, wherein each chuck comprises:
    a cavity having an open end at a surface of the holder, the surface being adjacent a workpiece when the holder holds the workpiece;
    a first orifice oriented to direct into the cavity a first gas flow that creates a vortex, the vortex having a low-pressure region that attracts the workpiece to the surface of the holder; and
    a second gas inlet orifice oriented to direct a second gas flow into the low-pressure region of the vortex.

10. The holder of claim 9, wherein the second gas flow is perpendicular to the first gas flow.

11. The holder of claim 10, wherein the first gas flow is parallel to the surface.

12. The chuck of claim 9, wherein the second gas flow is at an angle relative to the first gas flow.

13. The holder of claim 9, wherein each chuck has an orientation in the holder such that preferential exit of gas from the chuck is towards a periphery of the holder.

14. The holder of claim 13, wherein the preferential exit of gas from each of the chucks located on the periphery of the holder overlaps the exit gas from adjacent chucks located on the periphery.

15. The chuck of claim 13, further comprising a fixture in the cavity, the fixture being sized and shaped to accommodate a tool that adjusts the orientation of the chuck.

16. The holder of claim 13, wherein the preferential exit of gas from each of the chucks not located on the periphery of the holder is in a direction substantially between adjacent chucks.

17. The holder of claim 9, further comprising a common supply of gas connected to each of the chucks.

18. A holder comprising a plurality of chucks, wherein each chuck comprises:

a cavity having an open end at a surface of the holder, the surface being adjacent a workpiece when the holder holds the workpiece;

an orifice oriented to direct into the cavity a gas flow that creates a vortex, the vortex having a low-pressure region that attracts the workpiece to the surface of the holder, the gas flow exiting the cavity predominately within a range of exit paths; and a fixture in the cavity, the fixture being sized and shaped to accommodate a tool that adjusts an orientation of the chuck in the holder to change an orientation of the range of exit paths.

19. The chuck of claim 18, wherein the fixture is a slot.

* * * * *